United States Patent [19]

Hubbard et al.

[11] 4,379,291
[45] Apr. 5, 1983

[54] BEARING FAILURE INDICATOR FOR ROTATING ELECTRIC MACHINES

[75] Inventors: Larry E. Hubbard, Oolitic; Clifford A. Rhorer, Springville, both of Ind.

[73] Assignee: Texas Eastern Scientific Research, Inc., Pasadena, Tex.

[21] Appl. No.: 72,124

[22] Filed: Sep. 4, 1979

[51] Int. Cl.³ ............................................. G08B 21/00
[52] U.S. Cl. ................................. 340/682; 310/68 C; 340/648; 340/686
[58] Field of Search ............... 340/682, 648, 686; 318/798, 806, 466; 310/68 B, 68 C, 68 R

[56] References Cited

U.S. PATENT DOCUMENTS

| | | |
|---|---|---|
| 1,001,152 | 8/1911 | Lawrence ........................... 340/682 |
| 2,794,136 | 5/1957 | Kalikow et al. .................. 310/68 C |
| 3,611,036 | 10/1971 | Edson ................................. 340/648 |
| 3,824,579 | 7/1974 | Waseleski, Jr. et al. ............ 340/682 |
| 3,840,780 | 10/1974 | Sons .................................... 340/648 |
| 4,074,575 | 2/1978 | Bergman et al. .................... 340/682 |

*Primary Examiner*—Glen R. Swann, III
*Attorney, Agent, or Firm*—Woodard, Weikart, Emhardt & Naughton

[57] ABSTRACT

In a squirrel cage type of induction motor, conductive strips insulated from the stator are circularly spaced, ninety degrees apart, and project 0.003 inches into the rotor-to-stator clearance space. Upon excessive lateral rotor movement, it contacts a strip, closing a low voltage circuit triggering an alarm and de-energizing the motor. A reset button must be pressed to enable starting the motor.

7 Claims, 5 Drawing Figures

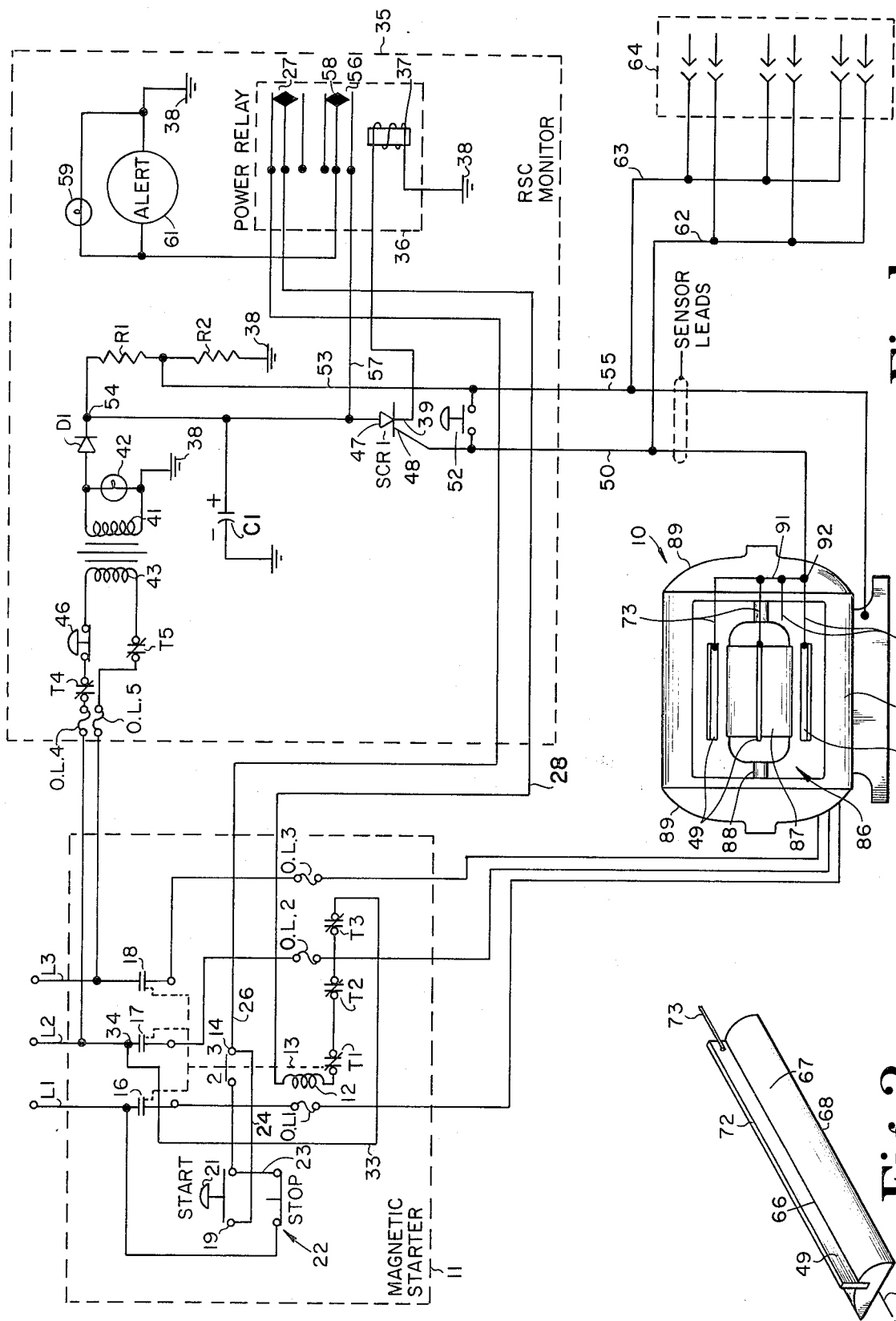

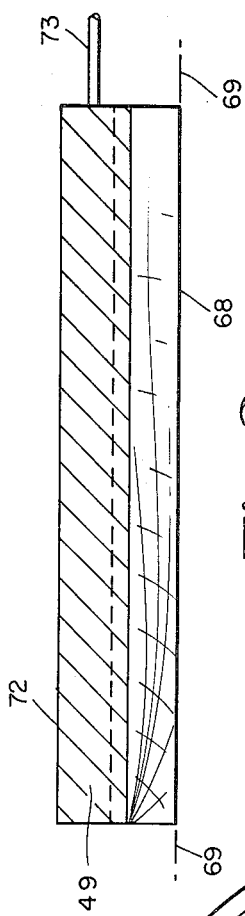
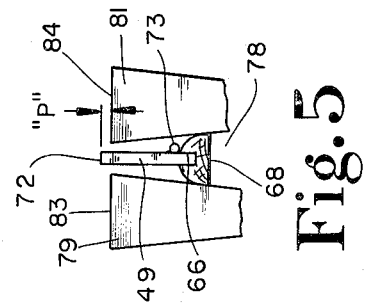
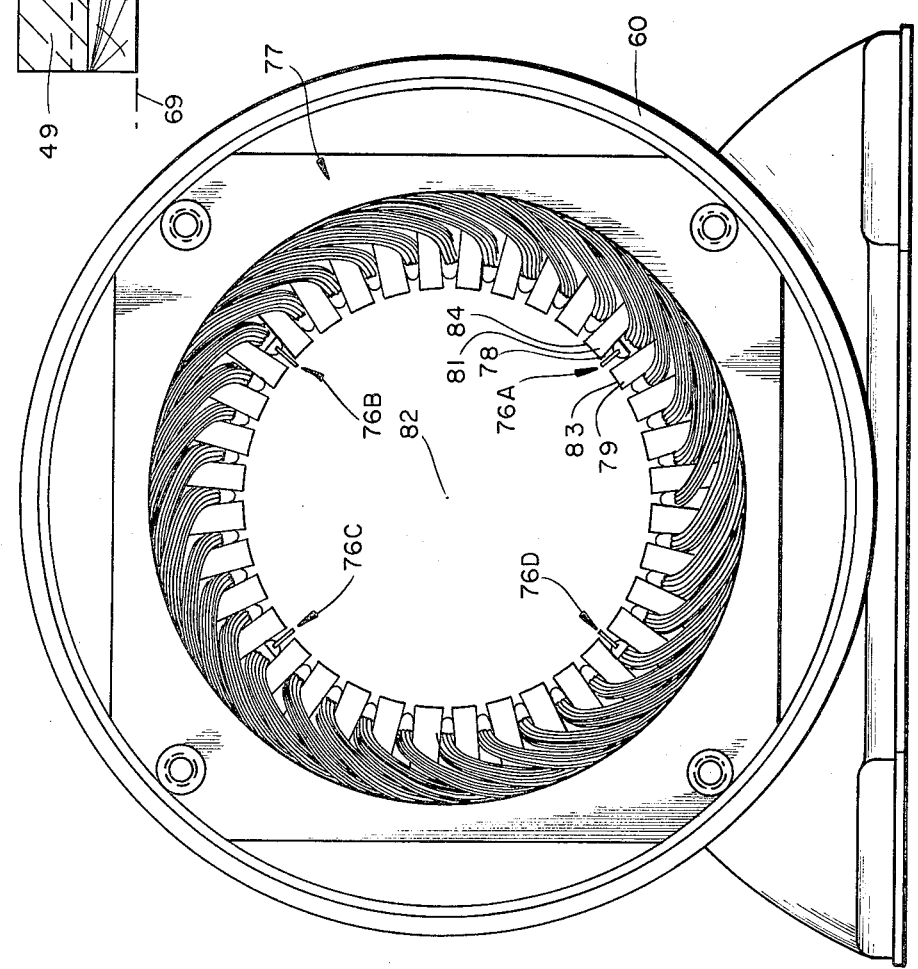
Fig. 3
Fig. 5
Fig. 4

BEARING FAILURE INDICATOR FOR ROTATING ELECTRIC MACHINES

BACKGROUND OF THE INVENTION

1. Field of the Invention

This invention relates generally to rotating electrical machines such as electric motors and generators, and more particularly to apparatus for detecting and indicating bearing failure.

2. Description of the Prior Art

Rotating electric machines are common in industry. Electric motors are widely used for driving a great variety of machinery. Many such motors fail prematurely, due to improper maintenance, particularly a failure to maintain lubrication of bearings.

The above mentioned problem has existed for many years. Various means have been devised for sensing and indicating impending or existing bearing failure. The U.S. Pat. Nos. 3,508,241 and 4,074,575 disclose such apparatus incorporated directly in bearings. In the earlier of these two patents, there is an auxiliary bearing to assist in handling the load upon failure of the main bearing, and the sensing and indicating device is intended to operate at the same time. The incorporation of supplementary or reserve bearings, and an alarm which is activated upon transfer of the load to such bearings when a main bearing fails, can also be found in U.S. Pat. Nos. 3,452,349 and 4,063,786.

A different approach for detecting bearing wear can be found in U.S. Pat. No. 4,107,603 where the displacement of a shaft-engaging sensor, in a direction transverse to the shaft, is used to create a signal for use in determining excessive shaft movement which may result from excessive bearing wear.

An approach using thermocouples is found in U.S. Pat. No. 3,582,928. A pair of proximity probes at 90 degrees with respect to each other and to the shaft axis, is used in U.S. Pat. No. 3,678,493. Capacitive effects in apparatus employing gas bearings are found in U.S. Pat. No. 3,176,286. Inductive effects are employed for bearing wear detection in a pump in U.S. Pat. No. 3,981,621 and in bearing protection for a generator, in U.S. Pat. No. 3,373,300. In the latter, sensor coils are disposed in stator slots at 180 degrees with respect to each other, and voltages resulting from uneven clearance between the rotor and the two sensor coils are utilized to generate a signal indicating a bearing failure.

Most of the aforementioned devices require special kinds of bearings or installation and do not appear to be readily retrofitted to existing conventional motors or generators. The above mentioned patent, U.S. Pat. No. 3,373,300 to Sullivan, may be, the most readily utilized in a conventional motor or generator.

SUMMARY OF THE INVENTION

Described briefly, in a typical embodiment of the present invention, a rotating electrical machine having a stator and rotor is provided with sensor means mounted to the stator and including a portion contactible by the rotor prior to contact of any other portion of the stator by the rotor, in the event of bearing failure. The sensor means is included in a circuit with a source of electrical energy and switch means whereby, when the sensor makes contact with a portion of the rotor, the switch means is operated to activate an indicator and, if the machine is a motor, de-energize the motor.

BRIEF DESCRIPTION OF THE DRAWINGS

FIG. 1 is an electro-mechanical schematic diagram of a sensing, indicating, and control system according to a typical embodiment of the present invention.

FIG. 2 is an orthographic view of a sensor assembly employed according to a typical embodiment.

FIG. 3 is an enlarged longitudinal section through the sensor assembly of FIG. 2.

FIG. 4 is a front end view of a motor stator with the sensors mounted therein according to a typical embodiment of the present invention.

FIG. 5 is an enlarged fragmentary end view of a stator slot with a sensor therein according to this invention.

DESCRIPTION OF THE PREFERRED EMBODIMENT

Referring now to the drawings in detail, and more particularly to FIG. 1, the motor to be protected is shown in a mechanical schematic way at 10 and is a three phase squirrel cage motor supplied through the power input lines L1, L2, and L3 from an electrical service (not shown). A magnetic starter 11 is employed including a starter relay coil 12 with an armature 13 operating contractors 14, 16, 17, and 18, the latter three being in the lines from the electric service through overload heaters OL1, OL2 and OL3 to the motor. Closure of the normally-open, momentary-contact start switch 19 by pushing the start button 21 supplies electrical energy from line L1 through the normally-closed stop contacts 22 and conductor 23 across the start switch to conductor 24. This energizes a holding circuit from conductor 24 through conductor 26, normally-closed power relay contacts 27, conductor 28, coil 12, and the normally-closed circuit breaker contactors T1, T2 and T3 (associated with the overload heaters OL1, OL2, OL3) and then to line L2 from conductor 33 at junction 34. Accordingly, when the start switch is closed, the coil 12 is energized and closes the relay contactor 14 and line contactors 16, 17, and 18, the closure of contacts 14 thereupon maintaining the holding circuit path across contacts 14 in parallel with start switch contacts 19, the latter opening as soon as start button 21 is released. Thus, the motor will be energized until the holding circuit is broken by de-energizing the coil 12, which will occur when the momentary-contact, normally-closed, stop switch 22 is opened, or when the holding circuit is otherwise opened. The description thus far (except for the contacts 27 in the holding circuit), is that of a conventional application of a magnetic starter to the control of an electric motor. The present invention involves the addition of the normally-closed switch in series with the magnetic starter operating coil 12.

In the illustration of FIG. 1, this switch is in the form of the normally-closed contacts 27 of a power relay 36 located in a rotor-stator clearance (RSC) monitor 35, of present invention. This relay is operable by a coil 37, which is provided with one terminal grounded at 38, and the other terminal connected to the load cathode 39 of a silicon controlled rectifier, SCR-1. The anode of SCR-1 is connected to the cathode of a rectifier diode D-1 whose anode is connected to the upper end of transformer coil 41, the lower end of which is grounded at 38. A light emitting diode 42 is connected across coil 41. The primary winding 43 of the transformer is supplied by the electrical service lines L2 and L3 through a pair of overload breakers T4 and T5 and a normally-closed, momentary-contact reset switch 46.

Further according to a typical embodiment of the present invention, a sensor circuit is available from the transformer secondary winding 41 through diode D-1, the anode 47 of the SCR-1, gate 48 of SCR-1, sensor strips 49 mounted in the stator of the motor, and, upon bearing failure, from this strip through the rotor to the motor housing, resistor R-2 and ground 38.

A normally-open, push-to-test switch 52 is connected between the gate 48 of the SCR-1 and a conductor 53 connected to the junction of resistors R-1 and R-2, the latter having its other end grounded at 38, and the former having its other end connected to the cathode of diode D-1 at junction 54. A lead 55 is connected to conductor 53 at switch 52 and extends from the monitor circuit for grounding to the motor frame 60, which can be conveniently done in the motor junction box.

In addition to the normally closed contacts 27 of the power relay, a normally-open contact pair is provided at 56. One contactor thereof is connected through conductor 57 to junction 54, while the other (moving) contactor 58 thereof is connected to one side of a red, light-emitting diode device 59 and to one side of an audible alarm device 61, such as an electronic "buzzer", the other side of both devices being returned to ground 38. Note that this ground is not common ground with motor frame 60.

Additional leads 62 and 63 are connected to conductors 50 and 55, respectively, and are provided with terminal pairs on a terminal strip 64 to accomodate accessory sensor inputs to activate the control and indicator circuit, if desired. Examples could be smoke detector switches, float switches, or normally-open limit switches of other types.

Having described the circuit construction generally, the details of the sensor strip and its mounting in the stator will now be described.

Referring to FIGS. 2 and 3, a sensor assembly is shown. It includes a conventional slot wedge of the half-round, wood strip type, but modified by an elongate groove 66 cut in the convex face 67, the groove being perpendicular to the flat face 68 and parallel to the axis 69 of the semi-cylinder of the wedge. A conductive strip 49, preferably made of copper, is snugly wedged into the groove 66. The exposed outer edge 72 is straight, but can have a portion intermediate the ends, cut away or recessed, if desired, to save copper. The strip has a lead 73 welded or otherwise affixed to it. This completes the sensor assembly.

As shown in FIG. 4, and further according to the invention, four of these sensor assemblies are located in four circularly spaced locations 76A, 76B, 76C and 76D, in the stator assembly 77, at 45, 135, 225 and 315 degrees about the stator axis from a point in a vertical plane containing the axis. For each of the sensor assemblies, the wedge is pushed in a slot such as 78 between poles 79 and 81 in the stator iron. When doing this, it is preferable that the varnish on the iron be slightly softened, as by heating the iron, so that the wedge can be securely seated in it and wedged in the stator slot, and thereby remain securely in position thereafter. The outer edge 72 of the strip 49 projects toward the cylindrical axis 82 of the stator, a slightly greater distance, than do faces 83 and 84 of the pole portions 79 and 81 (and the other poles too). Therefore, as the rotor 86 (FIG. 1) rotates, the core 87 thereof is closer to the sensor strip edges 72 than to any other part of the stator.

The sensor strip contact edge 72 preferably projects 0.003 inches from the top of the stator poles. This is dimension "P" in FIG. 5. Three of the sensor strips are shown schematically in FIG. 1, although relocated 45 degrees from their preferred index position shown in FIG. 4, for ease of illustration in FIG. 1. The rotor 86 is of the squirrel cage type, with the core 87 affixed to the shaft 88 mounted in bearings in the end bells 89, which are secured to frame 60. The rotor 86 is therefore electrically common with frame 60.

Leads 73 of all four of the sensor strips 49 are connected together or to a single tying lead 91 connected to lead 50 of the monitor, at junction 92. Therefore, if the rotor core contacts any one of the four sensor strips, it closes a circuit path from monitor lead 50, through leads 91 and 73 and the associated sensor strip and rotor core 87, rotor shaft 88 and bearings in end shells 89 to the motor frame 60 and thence to monitor lead 55.

OPERATION

Normal motor operation was described above. Our RSC monitor is energized by service lines L2 and L3 as described above. It is desirable that the secondary output voltage be such that, after rectification and smoothing, it produces 8 volts d.c. The positive potential applied to the anode of SCR-1 produces no current in the gate circuit path, until either the push-to-test switch 52 is closed, or the rotor touches one of the sensor strips. When either event occurs, the gate circuit path is completed through conductor 53 and resistor R-2 to ground. This fires the SCR-1, energizing power relay coil 37 in the load circuit of SCR-1.

The energized relay opens the starter holding circuit contacts 27 to de-energize the motor, and closes contacts 56 to energize the alarm lamp 59 and sounder 61.

Regardless of whether the SCR was fired by rotor-to-sensor contact, test switch closure, or by closure of a switch connected to one of the auxiliary inputs on terminal strip 64, it will remain conducting despite interruption of the gate circuit, until voltage is removed from the anode. This is possible by pushing the reset button in the monitor to open the reset switch, thus temporarily removing power from the transformer. Therefore, the monitor cannot be re-energized unless the reset button is pushed. If the rotor is contacting a sensor, the motor still cannot be energized.

In addition to the benefit derived from having the motor shut off by use of the monitor of this invention, it is readily adapted to already existing motors, as well as new motors. Also, by having the sensors project preferably 0.003 inches beyond the stator pole circle toward the rotor, they can be used in motors having a narrow rotor-stator clearance for high electrical efficiency, or in motors having greater clearance and which have less efficiency but can tolerate greater bearing wear and provide longer life before needing bearing replacement or overhaul.

Examples of some component values are:
  R-1: 68 ohms
  R-2: 820 ohms
  C-1: 1000 mfd While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

The invention claimed is:

1. In an electrical machine having a stator which is generally symetrical about an axis, and a rotor coaxial with the stator, with a plurality of pole portions on the stator, the improvement comprising:

sensor means having a fixed position relative to said stator and including a contact portion operable as a circuit switch contactor in response to radial movement of said rotor relative to said stator;

a source of electrical energy;

electronic switch means having a control element in series circuit relationship with said contact portion and said rotor and said source in a sensor circuit, said contact portion and said rotor serving as a normally-open sensor switch whereby said sensor circuit is non-conducting when said rotor is not contacting said contact portion, but conducting when said rotor contacts said contact portion;

a relay including an operator coil in series circuit with said source and a load circuit path of said electronic switch means, and said relay including relay contactor means operable by said coil responsive to conduction of current through said load circuit path and coil to operate said contactor means; and an indicator circuit including an indicator and a normally-open contact portion of said relay contactor means, for energizing said indicator in response to said operation of said contactor means by said relay coil.

2. The improvement of claim 1 wherein:
said electronic switch means is a silicon controlled rectifier.

3. The improvement of claim 1 wherein said stator has windings, the improvement further comprising:
motor control circuit means coupled to said windings for applying line current to said windings, and including magnetically closed and held line circuit breakers, and a breaker operating coil, and a coil energization holding circuit,
said relay contactor means including a normally-closed contact portion in series in said holding circuit, whereby operation of said contactor means by said relay coil opens said holding circuit to disable said breaker operating coil from maintaining said line circuit breakers closed.

4. The improvement of claim 3 wherein:
said motor control circuit means are included in a magnetic motor starter assembly; and
said energy source and electronic switch means and relay are in a clearance monitor assembly, with two leads from said assembly to said motor serving as a path from said control element to said contact portion and as a rotor-to-source path in said sensor circuit.

5. A method of sensing impending stator contact by a co-axial rotating rotor of an electric motor comprising the steps of:
placing sensor means in the circular space between the rotor and stator;
applying a sensor circuit voltage across the space between the rotor and sensor means;
using contact of the rotor with the sensor means as a switch closing a sensor circuit to establish a current in the sensor circuit;
and using current in the sensor circuit to energize annunciator means.

6. The method of claim 5 and further comprising the step of:
using current in the sensor circuit to de-energize the motor.

7. The method of claim 5 or 6 wherein current in the sensor circuit is used by causing it to fire a silicon controlled rectifier, the firing of which operates a power relay to apply energy to an annunciator and break a holding circuit in a magnetic starter assembly for the motor.

* * * * *